US012633923B2

(12) United States Patent
Jouanneau et al.

(10) Patent No.: US 12,633,923 B2
(45) Date of Patent: May 19, 2026

(54) LEVEL SHIFTING CIRCUIT

(71) Applicant: STMicroelectronics International N.V., Geneva (CH)

(72) Inventors: Thomas Pierre Georges Jouanneau, ST-Egreve (FR); Catherine Margaret Simone Marie Popon, Seyssins (FR); Mario Martino Zampogna, Catania (IT); Léa Sandrina Frédérique Enginger, Grenoble (FR)

(73) Assignee: STMicroelectronics International N.V., Geneva (CH)

( * ) Notice: Subject to any disclaimer, the term of this patent is extended or adjusted under 35 U.S.C. 154(b) by 42 days.

(21) Appl. No.: 18/496,179

(22) Filed: Oct. 27, 2023

(65) Prior Publication Data

US 2025/0141451 A1     May 1, 2025

(51) Int. Cl.
*H03K 19/0185*     (2006.01)
*G11C 7/10*     (2006.01)
*G11C 7/12*     (2006.01)

(52) U.S. Cl.
CPC ... *H03K 19/018528* (2013.01); *G11C 7/1057* (2013.01); *G11C 7/12* (2013.01)

(58) Field of Classification Search
CPC . H03K 19/018528; G11C 7/1057; G11C 7/12
See application file for complete search history.

(56) References Cited

U.S. PATENT DOCUMENTS 6,157,361 A     12/2000  Kubota
6,407,579 B1     6/2002  Goswick
6,838,924 B1     1/2005  Davies, Jr.
7,274,209 B1     9/2007  Reinschmidt
7,468,615 B1     12/2008  Tan
7,592,849 B2     9/2009  Campardo
7,919,983 B1     4/2011  Rana (Continued)

FOREIGN PATENT DOCUMENTS

IT     102022000007508     4/2022
KR     20130131070 A     * 12/2013     ..... H03K 19/018528

OTHER PUBLICATIONS

Extended European Search Report, EP Application No. 25192337.1, Date of completion of the search Dec. 15, 2025, 11 pages.

*Primary Examiner* — Lincoln D Donovan
*Assistant Examiner* — James G Yeaman
(74) *Attorney, Agent, or Firm* — Slater Matsil, LLP

(57)     ABSTRACT

A level shifter includes a first input having low voltage switches, and is configured to receive an input voltage and to generate a second voltage which varies between a first low voltage and a first high voltage. The level shifter also includes a first output having medium voltage switches, and is configured to receive the second voltage and to generate a third voltage which varies between the first low voltage and a second high voltage. The level shifter also includes a second input having medium voltage switches, and is configured to receive the third voltage and to generate a fourth voltage which varies between a second low voltage and the second high voltage. The level shifter also includes a second output having medium voltage switches, and is configured to receive the fourth voltage and generate a fifth voltage which varies between the second low voltage and a third high voltage.

20 Claims, 7 Drawing Sheets

(56)  References Cited

U.S. PATENT DOCUMENTS

| | | | |
|---|---|---|---|
| 8,237,487 B2 * | 8/2012 | Shim | H03K 3/356113 |
| | | | 326/62 |
| 9,203,411 B2 | 12/2015 | Yu | |
| 9,306,553 B2 * | 4/2016 | Rajaee | H03K 19/01714 |
| 9,589,627 B1 | 3/2017 | Wilson | |
| 10,911,047 B1 | 2/2021 | Shetty | |
| 11,409,314 B2 | 8/2022 | Liu | |
| 11,606,030 B1 | 3/2023 | Kruiskamp | |
| 12,095,455 B2 | 9/2024 | Jiang | |
| 12,212,320 B2 | 1/2025 | Conte | |
| 2003/0042965 A1 | 3/2003 | Kanno | |
| 2006/0192587 A1 * | 8/2006 | Bhattacharya | H03K 3/012 |
| | | | 326/80 |
| 2007/0008804 A1 | 1/2007 | Lu et al. | |
| 2007/0241804 A1 * | 10/2007 | Campardo | H03K 3/356113 |
| | | | 327/333 |
| 2009/0021292 A1 * | 1/2009 | Yu | H03K 3/356182 |
| | | | 327/333 |
| 2009/0302924 A1 | 12/2009 | Kim | |
| 2012/0112790 A1 * | 5/2012 | Huang | H03K 3/356182 |
| | | | 326/81 |
| 2013/0249595 A1 * | 9/2013 | Ogawa | G11C 7/1084 |
| | | | 326/63 |
| 2014/0253211 A1 | 9/2014 | Lnu | |
| 2016/0162294 A1 | 6/2016 | Baker | |
| 2016/0182051 A1 | 6/2016 | Yang et al. | |
| 2016/0322972 A1 | 11/2016 | Hu | |
| 2018/0061495 A1 | 3/2018 | Conte | |
| 2019/0312575 A1 | 10/2019 | Tiwari | |
| 2020/0365205 A1 | 11/2020 | Chevallier et al. | |
| 2022/0149837 A1 | 5/2022 | Lin | |
| 2022/0182059 A1 | 6/2022 | Yagi | |
| 2023/0100170 A1 | 3/2023 | Beccue | |
| 2023/0238946 A1 | 7/2023 | Lu et al. | |
| 2023/0308101 A1 * | 9/2023 | Sung | H03K 19/017 |
| 2024/0106348 A1 | 3/2024 | Yagi | |
| 2024/0213984 A1 | 6/2024 | Kishinami | |

* cited by examiner

800

810 — RECEIVE FIRST VOLTAGE AND GENERATE SECOND VOLTAGE

820 — RECEIVE SECOND VOLTAGE AND GENERATE THIRD VOLTAGE

830 — RECEIVE THIRD VOLTAGE AND GENERATE FOURTH VOLTAGE

840 — RECEIVE FOURTH VOLTAGE AND GENERATE FIFTH VOLTAGE

850 — RECEIVE FIFTH VOLTAGE AND GENERATE SIXTH VOLTAGE

LEVEL SHIFTING CIRCUIT

TECHNICAL FIELD

The present disclosure generally relates to a level shifting circuit, as well as to methods for level shifting signals.

BACKGROUND

Some electronic systems benefit from level shifter circuits. For example, some electronic systems have a digital control circuit, such as a processor or a controller, which generates output signals having a lower voltage range (e.g., 0 V-1 V), where the other circuit uses input signals having a higher voltage range (e.g., 2 V-5 V). These types of electronic systems may use level shifter circuits to convert lower voltage range output signals from the controller to higher voltage range input signals for the other circuit.

SUMMARY

One embodiment is a level shifter circuit, including a first stage input circuit configured to receive an input voltage and generate a second voltage, where the second voltage varies between a first low voltage and a first high voltage, and where the first stage input circuit includes a plurality of low voltage threshold switches. The level shifter also includes a first stage output circuit configured to receive the second voltage and to generate a third voltage, where the third voltage varies between the first low voltage and a second high voltage, and where the first stage output circuit includes a first plurality of medium voltage switches. The level shifter also includes a second stage input circuit configured to receive the third voltage and to generate a fourth voltage, where the fourth voltage varies between a second low voltage and the second high voltage, and where the second stage input circuit includes a second plurality of medium voltage switches. The level shifter also includes a second stage output circuit configured to receive the fourth voltage and generate a fifth voltage, where the fifth voltage varies between the second low voltage and a third high voltage, and where the second stage output circuit includes a third plurality of medium voltage switches. The level shifter also includes a buffering circuit configured to receive the fifth voltage and to generate an output voltage, where the output voltage varies between a third low voltage and the third high voltage.

Another embodiment is another embodiment is an array circuit. The array circuit includes an array of devices, where a plurality of devices of the array each include at least one high voltage switch. The array circuit also includes a controller configured to generate a plurality of first control signals for controlling the array of devices The array circuit also includes an array of level shifters, each level shifter configured to receive one of the first control signals from the controller as an input voltage, to generate one of a plurality of second control signals as an output voltage, and to provide the output voltage to one of the array of devices. The level shifters each include a first stage input circuit configured to receive the input voltage and generate a second voltage, where the second voltage varies between a first low voltage and a first high voltage, and where the first stage input circuit includes a plurality of low voltage threshold switches. The level shifters also each include a first stage output circuit configured to receive the second voltage and to generate a third voltage, where the third voltage varies between the first low voltage and a second high voltage, and where the first stage output circuit includes a first plurality of medium voltage switches. The level shifters also each include a second stage input circuit configured to receive the third voltage and to generate a fourth voltage, where the fourth voltage varies between a second low voltage and the second high voltage, and where the second stage input circuit includes a second plurality of medium voltage switches. The level shifters also each include a second stage output circuit configured to receive the fourth voltage and generate a fifth voltage, where the fifth voltage varies between the second low voltage and a third high voltage, and where the second stage output circuit includes a third plurality of medium voltage switches. The level shifters also each include, a buffering circuit configured to receive the fifth voltage and to generate the output voltage, where the output voltage varies between a third low voltage and the third high voltage.

Another embodiment is a method of using a level shifter circuit. The method includes, with a first stage input circuit including a plurality of low voltage threshold switches, receiving an input voltage, and generating a second voltage based in part on the input voltage, where the second voltage varies between a first low voltage and a first high voltage. The method also includes, with a first stage output circuit including a first plurality of medium voltage switches receiving the second voltage, and generating a third voltage based in part on the second voltage, where the third voltage varies between the first low voltage and a second high voltage. The method also includes, with a second stage input circuit including a second plurality of medium voltage switches, receiving the third voltage, and generating a fourth voltage based in part on the third voltage, where the fourth voltage varies between a second low voltage and the second high voltage. The method also includes, with a second stage output circuit including a third plurality of medium voltage switches, receiving the fourth voltage, and generating a fifth voltage based in part on the fourth voltage, where the fifth voltage varies between the second low voltage and a third high voltage. The method also includes, with a buffering circuit receiving the fifth voltage, and generating an output voltage based in part on the fifth voltage, where the output voltage varies between a third low voltage and the third high voltage.

BRIEF DESCRIPTION OF THE DRAWINGS

For a more complete understanding of one or more embodiments of the present disclosure, and the advantages thereof, reference is now made to the following descriptions taken in conjunction with the accompanying drawings, in which.

Figure 1:
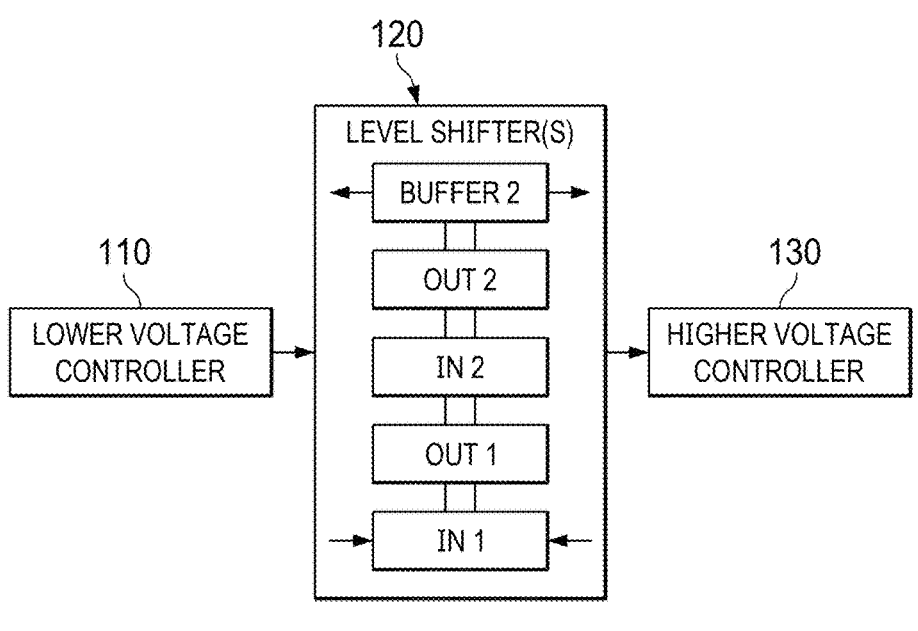
FIG. 1 shows a schematic circuit diagram of an electronic system according to some embodiments.

Corresponding numerals and symbols in the different figures generally refer to corresponding parts unless otherwise indicated. The figures are drawn to illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

Illustrative embodiments of the system and method of the present disclosure are described below. In the interest of clarity, all features of an actual implementation may not be described in this specification. It will of course be appreciated that in the development of any such actual embodiment, numerous implementation-specific decisions may be made to achieve the developer's specific goals, such as compliance with system-related and business-related constraints, which will vary from one implementation to another. Moreover, it should be appreciated that such a development effort might be complex and time-consuming but would nevertheless be a routine undertaking for those of ordinary skill in the art having the benefit of this disclosure.

Reference may be made herein to the spatial relationships between various components and to the spatial orientation of various aspects of components as the devices are depicted in the attached drawings. However, as will be recognized by those skilled in the art after a complete reading of the present disclosure, the devices, members, apparatuses, etc. described herein may be positioned in any desired orientation. Thus, the use of terms such as "above," "below," "upper," "lower," or other like terms to describe a spatial relationship between various components or to describe the spatial orientation of aspects of such components should be understood to describe a relative relationship between the components or a spatial orientation of aspects of such components, respectively, as the device described herein may be oriented in any desired direction.

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope. Unless specified otherwise, the expressions "around", "approximately", and "substantially" signify within 10%, and preferably within 5% of the given value or, such as in the case of substantially zero, less than 10% and preferably less than 5% of a comparable quantity.

The embodiments discussed herein illustrate various aspects of level shifter circuit technology which use minimal die area to implement, and which provide accurate, fast, and low power level shifting of signals.

High voltage logic signals are often needed to control a circuit, such as a non-volatile memory array, which may typically be found, for example, in general purpose microcontrollers or pixel arrays, which are found, for example, in image sensor circuits. A large numbers of high voltage signals (e.g., >4V) may be controlled with low voltages signals (e.g., 1V). Voltage translation may be done by level shifter circuits, which are placed with in large numbers according to the number of signals to control. The discussed embodiments use small amounts of area so that the overall system size, therefore is reduced.

Some manufacturing processes have options for forming switches, such as MOSFETs, or other transistors of different types. For example, a manufacturing process may have low voltage switches, medium voltage switches, and high voltage switches. In various embodiments, a low voltage transistor operates at 40% to 80% of the operational Vds/Vgs of the medium voltage transistor, which operates at 40% to 80% of the operational Vds/Vgs of the high voltage transistor. The threshold voltage of the medium voltage transistor is about 1.5× to 2.5× of the threshold voltage of the low voltage transistor while the threshold voltage of the high voltage transistor is about 3× to 5× of the threshold voltage of the medium voltage transistor. In some embodiments, the low voltage switches have about 1 V Vds and Vgs maximum voltage allowed, the medium voltage switches have about 2 V Vds and Vgs maximum voltage allowed, and the high voltage switches have greater than about 4 V Vds and Vgs maximum voltage allowed. In some embodiments, the gate turn on threshold of the low voltage switches is about 0.2 V or 0.3 V. In some embodiments, the gate turn on threshold of the medium voltage switches is about 0.4 V. In some embodiments, the gate turn on threshold of the high voltage switches is about 0.6 V or 0.7 V. In some embodiments, the low voltage switches use less area than the medium voltage switches, and the medium voltage switches use less area than the high voltage switches.

Logic signal voltage level shifting from low voltage (typ. 1V) input to a high voltage (>4V typ.) output, generally causes voltages across low voltage switches to exceed their maximum voltage tolerance thresholds. Particular level shifter architectures may be used to ensure correct functionality while protecting protect individual transistors from overvoltage stressing. The functionality may be described as generating an output signal that varies over a desired output voltage level range based on input signals varying over a particular input voltage level range, where the output signals preserve the input signal encoding, such that logic 0 input signals cause logic 0 output signals to be generated and logic 1 input signals cause logic 1 output signals to be generated.

Sometimes, protection of individual transistors can be accomplished by careful design to ensure they are not exposed to voltages or current greater than their allowed limits so that products are functional throughout the life of the product.

FIG. 1 shows a schematic circuit diagram of an electronic system 100 according to some embodiments. Electronic system 100 includes a controller 110, level shifting circuit 120, and controlled circuit 130.

Controller 110 generates control signals for controlled circuit 130 using, for example, low voltage switches, where the control signals generated by controller 110 have a lower level voltage range, such as from 0 V to 1 V, or another voltage range. In some embodiments, controller 110 is or includes a controller or processor for a system including an array of devices, such as a memory, a display, or an image capture device.

Controlled circuit 130 performs its functions using circuits having, for example, high voltage switches which generate signals having a higher voltage range, such as from 2 V to 5 V, or another voltage range. In addition, controlled circuit 130 generates the signals in response to input control signals having the higher voltage range. In some embodiments, controlled circuit 130 includes an array of unit cell devices, such as for an array of memory cells, an array of display cells, or an array of image capture cells.

Level shifting circuit 120 includes one or more level shifter circuits, examples of which are described in more detail below. The level shifting circuit 120 receives the lower voltage control signals from controller 110 and generates the higher voltage control signals for controlled circuit 130.

Figure 2:
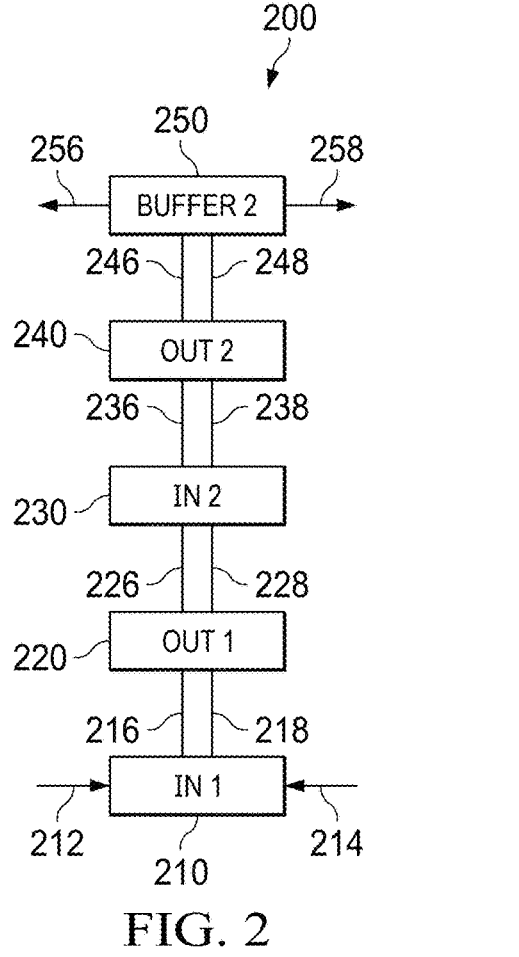
FIG. 2 shows a block diagram of a level shifter circuit according to some embodiments.

FIG. 2 shows a block diagram of a level shifter circuit 200 according to some embodiments. Level shifter circuit 200 may be used in or as level shifting circuit 120. For example, level shifting circuit 120 may include an embodiment of level shifter circuit 200 for each of a number of control signals generated by controller 110 for controlled circuit 130. Accordingly, in some embodiments level shifter circuit 200 may include many instances of a level shifter circuit such as level shifter circuit 200. Level shifter circuit 200 includes first stage input portion 210, first stage output portion 220, second stage input portion 230, second stage output portion 240, and second stage buffering portion 250.

The illustrated embodiment of level shifter circuit 200, each component receives a differential input signal, and generates a differential output signal. In some embodiments, one or more or all components of level shifter circuit 200 receives a single ended input. In some embodiments, one or more or all components of level shifter circuit 200 generates a single ended output. In some embodiments, one or more or all components of level shifter circuit 200 receives a single ended input and generates a single ended output.

First stage input portion 210 includes switches which receive an input signal at input nodes 212 and 214 from, for example, a controller, such as controller 110. In some embodiments, the switches of first stage input portion 210 include low voltage switches. In some embodiments, the switches of first stage input portion 210 include medium voltage switches. In some embodiments, the switches of first stage input portion 210 include high voltage switches.

The input signal at input nodes 212 and 214 may have a lower level voltage range, such as from 0 V to 1 V, or another voltage range. Based on the input signal, first stage input portion 210 generates signals for first stage output portion 220 at nodes 216 and 218, where the signals for first stage output portion 220 may also have the lower level voltage range. In some embodiments, the signals for the first stage output portion 220 have a different voltage range.

In some embodiments, first stage input portion 210 is inverting, such that the output signal and the input signal have opposite polarity. In some embodiments, first stage input portion is noninverting, such that the input signal and the output signal have the same polarity.

First stage output portion 220 includes switches which receive an input signal at input nodes 216 and 218 from first stage input portion 210. In some embodiments, the switches of first stage output portion 220 include low voltage switches. In some embodiments, the switches of first stage output portion 220 include medium voltage switches. In some embodiments, the switches of first stage output portion 220 include high voltage switches.

The input signal at nodes 216 and 218 may have a lower level voltage range, such as from 0 V to 1 V, or another voltage range. Based on the input signal at nodes 216 and 218, first stage output portion 220 generates signals for second stage input portion 230 at nodes 226 and 228, where the signals for second stage input portion 230 may have a voltage range different from the lower level voltage range. For example, the signals for the second stage input portion 230 have a range greater than the lower level voltage range. In some embodiments, the signals for the second stage input portion 230 have a second voltage range, such as from 0 V to 4V, or another voltage range.

In some embodiments, first stage output portion 220 is inverting, such that the output signal and the input signal have opposite polarity. In some embodiments, first stage input portion is noninverting, such that the input signal and the output signal have the same polarity.

Second stage input portion 230 includes switches which receive an input signal at input nodes 226 and 228 from first stage output portion 220. In some embodiments, the switches of second stage input portion 230 include low voltage switches. In some embodiments, the switches of second stage input portion 230 include medium voltage switches. In some embodiments, the switches of second stage input portion 230 include high voltage switches.

Based on the input signal at nodes 226 and 228, second stage input portion 230 generates signals for second stage output portion 240 at nodes 236 and 238. The signals for second stage output portion 240 may have a voltage range different from the voltage range of the input signal at nodes 226 and 228. In some embodiments, the signals for second stage output portion 240 may have a voltage range which is the same as the voltage range of the input signal at nodes 226 and 228. For example, the signals for the second stage output portion 240 have a range greater than the lower level voltage range. In some embodiments, the signals for the second stage output portion 240 have a voltage range, such as from 2 V to 4 V, or another voltage range.

In some embodiments, second stage input portion 230 is inverting, such that the output signal and the input signal have opposite polarity. In some embodiments, first stage input portion is noninverting, such that the input signal and the output signal have the same polarity.

Second stage output portion 240 includes switches which receive an input signal at input nodes 236 and 238 from second stage input portion 230. In some embodiments, the switches of second stage output portion 240 include low voltage switches. In some embodiments, the switches of second stage output portion 240 include medium voltage switches. In some embodiments, the switches of second stage output portion 240 include high voltage switches.

Based on the input signal at nodes 236 and 238, second stage output portion 240 generates signals for second stage buffer portion 250 at nodes 246 and 248. The signals for second stage buffer portion 250 may have a voltage range which is the same as the voltage range of the input signal at nodes 236 and 238. In some embodiments, the signals for second stage buffer portion 250 may have a voltage range which is different from the voltage range of the input signal at nodes 236 and 238. For example, the signals for the second stage buffer portion 250 have a range greater than the voltage range of the input signal as nodes 236 and 238. In some embodiments, the signals for the second stage buffer portion 250 have a voltage range from 2 V to 5 V, or another voltage range.

In some embodiments, second stage output portion 240 is inverting, such that the output signal and the input signal have opposite polarity. In some embodiments, first stage input portion is noninverting, such that the input signal and the output signal have the same polarity.

Second stage buffer portion 250 includes switches which receive an input signal at input nodes 246 and 248 from second stage output portion 240. In some embodiments, the switches of second stage buffer portion 250 include low voltage switches. In some embodiments, the switches of second stage buffer portion 250 include medium voltage switches. In some embodiments, the switches of second stage buffer portion 250 include high voltage switches.

Based on the input signal at nodes 246 and 248, second stage buffer portion 250 generates the output signals of level shifter circuit 200 at nodes 256 and 258. The output signals for level shifter circuit 200 may have a voltage range which is the same as the voltage range of the input signal at nodes 246 and 248. In some embodiments, the output signals for the level shifter circuit 200 have a voltage range from 2 V to 5 V, or another voltage range.

In some embodiments, second stage buffer portion 250 is inverting, such that the output signal and the input signal have opposite polarity. In some embodiments, first stage input portion is noninverting, such that the input signal and the output signal have the same polarity.

Figure 3:
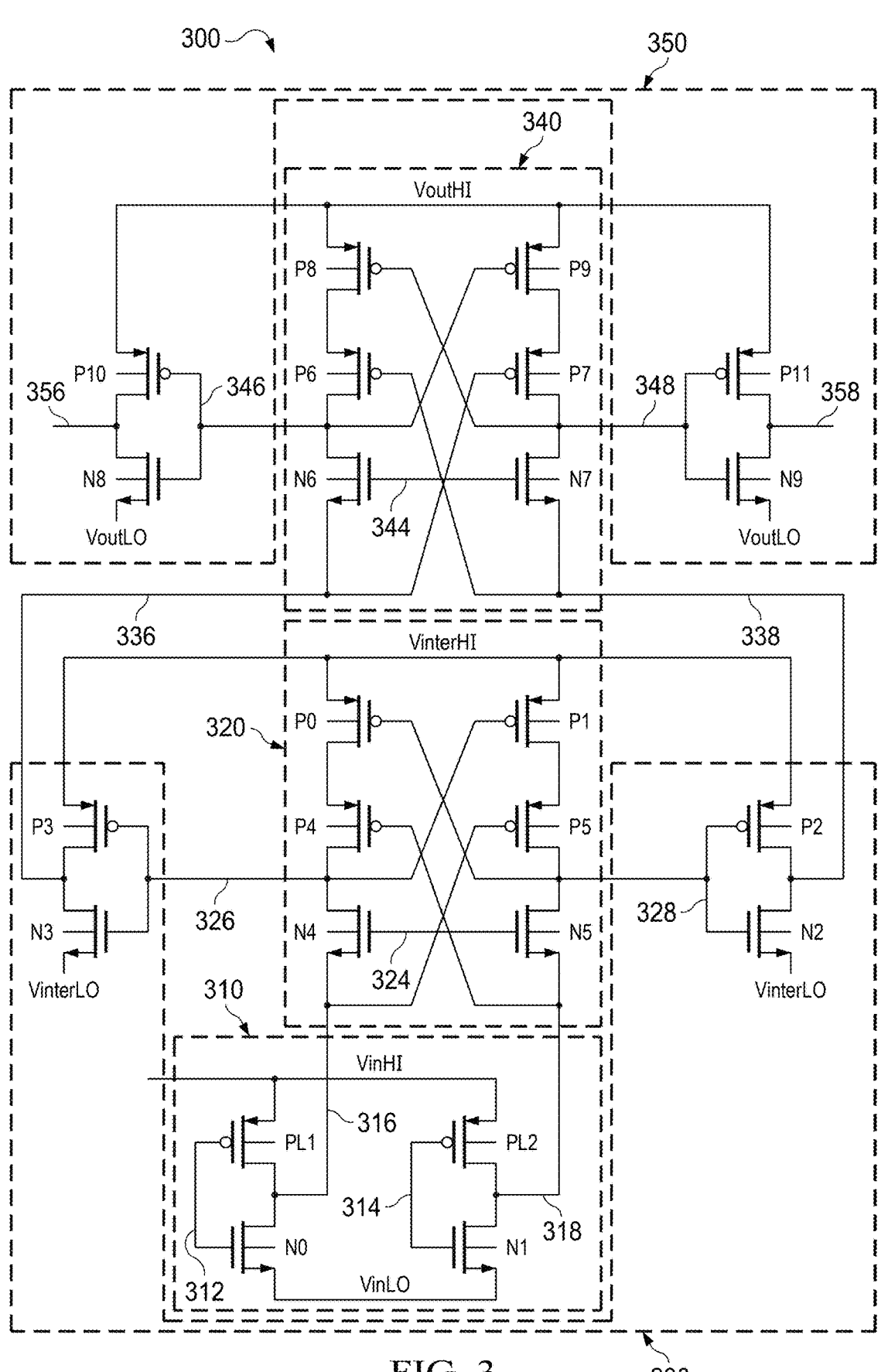
FIG. 3 shows a schematic circuit diagram of a level shifter circuit according to some embodiments.

FIG. 3 shows a schematic circuit diagram of a level shifter circuit 300 according to some embodiments. Level shifter circuit 300 is a nonlimiting example of level shifter circuit 200, and includes first stage input portion 310, first stage output portion 320, second stage input portion 330, second stage output portion 340, and second stage buffering portion 350.

First stage input portion 310 includes switches which receive an input signal at input nodes 312 and 314 from, for example, a controller, such as controller 110. In alternative embodiments, node 316 is connected to node 314, and the input signal from the controller is single ended. In the illustrated embodiment, the switches of first stage input portion 310 are low voltage switches.

The input signal at nodes 312 and 314 may have a first voltage range, between voltage VinLo and voltage VinHI, such as from 0 V to 1 V, or another voltage range. Based on the input signal, first stage input portion 310 generates signals for first stage output portion 320 at nodes 316 and 318, where the signals for first stage output portion 320 may also have the first voltage range. In some embodiments, the signals for the first stage output portion 320 have a different voltage range.

In some embodiments, first stage input portion 310 is inverting, such that the output signal and the input signal have opposite polarity. In some embodiments, first stage input portion is noninverting, such that the input signal and the output signal have the same polarity.

First stage output portion 320 includes switches which receive an input signal at input nodes 316 and 318 from first stage input portion 310. In some embodiments, the switches of first stage output portion 320 include low voltage switches. In some embodiments, the switches of first stage output portion 320 include medium voltage switches. In some embodiments, all of the switches of first stage output portion 320 are medium voltage switches. In some embodiments, the switches of first stage output portion 320 include high voltage switches.

In the illustrated embodiment, the input signal at nodes 316 and 318 may have the first voltage range, such as from 0 V to 1 V, or another voltage range. Based on the input signal at nodes 316 and 318, first stage output portion 320 generates signals for second stage input portion 330 at nodes 326 and 328, where the signals for second stage input portion 330 may have a second voltage range between voltage VinLO and voltage VinterHI, which is different from the first voltage range. For example, the signals for the second stage input portion 330 have a range greater than the first voltage range, such as from 0 V to 4 V, or another voltage range.

In some embodiments, first stage output portion 320 is inverting, such that the output signal and the input signal have opposite polarity. In some embodiments, first stage output portion 320 is noninverting, such that the input signal and the output signal have the same polarity.

Second stage input portion 330 includes switches which receive an input signal at input nodes 326 and 328 from first stage output portion 320. In some embodiments, the switches of second stage input portion 330 include low voltage switches. In some embodiments, the switches of second stage input portion 330 include medium voltage switches. In some embodiments, the switches of second stage input portion 330 include high voltage switches. In some embodiments, all of the switches of second stage input portion 330 are high voltage switches.

Based on the input signal at nodes 326 and 328, second stage input portion 330 generates signals for second stage output portion 340 at nodes 336 and 338. The signals for second stage output portion 340 may have a third voltage range between voltage VinterLO and voltage VinterHI, which is different from the voltage range of the input signal at nodes 326 and 328. In some embodiments, the third voltage range is the same as the voltage range of the input signal at nodes 326 and 328. For example, the signals for the second stage output portion 340 have a range greater than the first voltage range, such as a voltage range equal to the second voltage range. In some embodiments, the signals for the second stage output portion 340 have a voltage range, such as from 0 V to 2 V, or another voltage range. In some embodiments, the signals for the second stage output portion 340 have a third voltage range different from the first and second voltage ranges, such as from 2 V to 4 V, or another voltage range.

In some embodiments, second stage input portion 330 is inverting, such that the output signal and the input signal have opposite polarity. In some embodiments, first stage input portion is noninverting, such that the input signal and the output signal have the same polarity.

Second stage output portion 340 includes switches which receive an input signal at input nodes 336 and 338 from second stage input portion 330. In some embodiments, the switches of second stage output portion 340 include low voltage switches. In some embodiments, the switches of second stage output portion 340 include medium voltage switches. In some embodiments, the switches of second stage output portion 340 include high voltage switches. In some embodiments, all of the switches of second stage output portion 340 are high voltage switches.

Based on the input signal at nodes 336 and 338, second stage output portion 340 generates signals for second stage buffer portion 350 at nodes 346 and 348. The signals for second stage buffer portion 350 may have a fourth voltage range between voltage VinterLO and voltage VoutHI, which is, for example, different from the voltage range of the input signal at nodes 336 and 338. For example, the signals for the second stage buffer portion 350 have a range greater than the voltage range of the input signal as nodes 336 and 338. In some embodiments, the signals for the second stage buffer portion 350 have a voltage range from 2 V to 5 V, or another voltage range.

In some embodiments, second stage output portion 340 is inverting, such that the output signal and the input signal have opposite polarity. In some embodiments, first stage input portion is noninverting, such that the input signal and the output signal have the same polarity.

Second stage buffer portion 350 includes switches which receive an input signal at input nodes 346 and 348 from second stage output portion 340. In some embodiments, the switches of second stage buffer portion 350 include low voltage switches. In some embodiments, the switches of second stage buffer portion 350 include medium voltage switches. In some embodiments, the switches of second stage buffer portion 350 include high voltage switches. In some embodiments, all of the switches of second stage buffer portion 350 are high voltage switches.

Based on the input signal at nodes 346 and 348, second stage buffer portion 350 generates the output signals of level shifter circuit 300 at nodes 356 and 358. The output signals for level shifter circuit 300 may have a fifth voltage range between voltage VoutLO and voltage VoutHI, which is, for example, the same as the voltage range of the input signal at nodes 346 and 348. In some embodiments, the output signals for the level shifter circuit 300 have a voltage range from 2 V to 5 V, or another voltage range. In some embodiments, the output signals for level shifter circuit 300 may have a fifth voltage range which is different from the voltage range of the input signal at nodes 346 and 348.

In some embodiments, second stage buffer portion 350 is inverting, such that the output signal and the input signal have opposite polarity. In some embodiments, first stage input portion is noninverting, such that the input signal and the output signal have the same polarity.

The following examples of configurations and relationships between various voltages may be used, for example, to ensure or maximize functionality while preventing or minimizing voltage stress or overstress of the various transistors.

In some embodiments, the cascode voltage at node 344 is equal to the voltage VinterHI. In some embodiments, the cascode voltage at node 344 is less than the voltage VinterHI+the Vgs threshold voltages of cascode switches N6 and N7, for example, to limit leakage. In some embodiments, the cascode voltage at node 344 is greater than the voltage VinterLO+the Vgs threshold voltages of switches N2 and N3+an overdrive margin voltage for switches N2 and N3. In some embodiments, the overdrive margin voltage is sufficient to cause switches N2 and N3 to be conductive enough to discharge nodes 336 and 338.

In some embodiments, voltage VinterLO is equal to voltage VoutLO. In some embodiments, voltage VinterLO is less than voltage VoutLO+the Vgs threshold voltages of buffer switches N8 and N9, for example, to limit leakage. In some embodiments, voltage VinterLO is greater than voltage VoutHI-maximum voltage allowed on high voltage switches.

In some embodiments, switches P3 and P2 are omitted. When used, switches P3 and P2 increase speed by increasing the voltages at nodes 336 and 338. In embodiments with voltage VoutHI not always greater than voltage VinterHI, switches P2 and P3 may be omitted, for example, to avoid leakage from voltage VinterHI to voltage VoutHI or from voltage VoutHI to voltage VinterHI through cascode switches N6 and N7.

In some embodiments, switches P6 and P7 are omitted. For example, in embodiments with voltage VoutHI greater than voltage VinterHI by a voltage greater than a limit may use switches P6 and P7, for example, to improve speed. And embodiments with voltage VoutHI greater than voltage VinterHI by a voltage less than the limit may omit switches P6 and P7.

In some embodiments, switches P4 and P5 are omitted. For example, in embodiments with voltage VinterHI greater than voltage VinLO by a voltage greater than a limit may use switches P4 and P5, for example, to improve speed. And embodiments with voltage VinterHI greater than voltage VinLO by a voltage less than the limit may omit switches P6 and P7.

In some embodiments, switches PL1 and PL2 are omitted. When used, switches PL1 and PL2 increase speed by increasing the voltages at nodes 316 and 318. In embodiments with voltage VinterHI not always greater than voltage VinHI, switches PL1 and PL2 may be omitted, for example, to avoid leakage from voltage VinterHI to voltage VinHI or from voltage VinHI to voltage VinterHI through cascode switches N4 and N5.

In some embodiments, one of outputs VOUT and VOUT_N is not needed, and either switches N9 and P11 are omitted or switches N8 and P10 are omitted, for example, to save area and improve speed.

Figure 4:
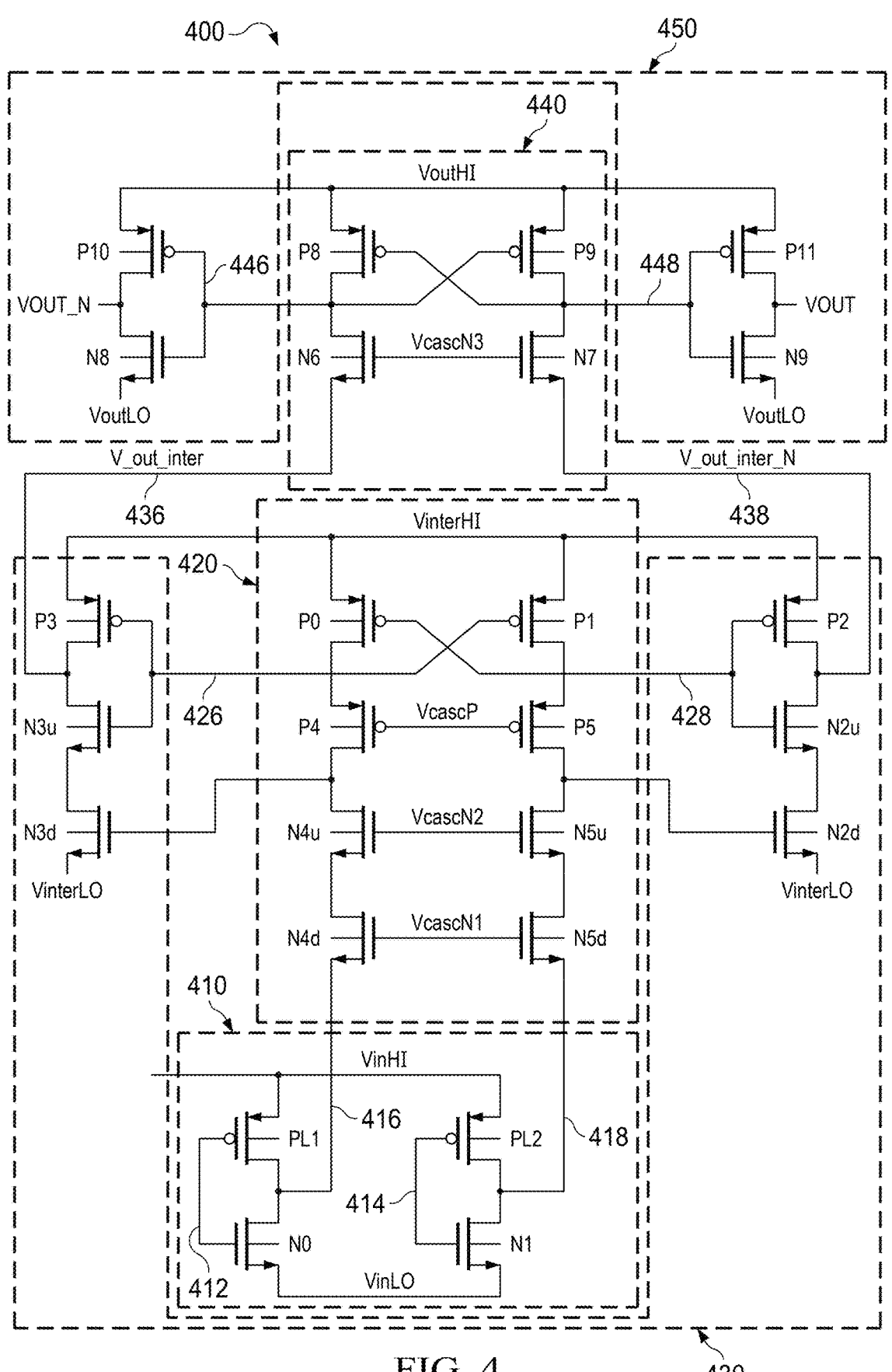
FIG. 4 shows a schematic circuit diagram of a level shifter circuit according to some embodiments.

FIG. 4 shows a schematic circuit diagram of a level shifter circuit 400 according to some embodiments. Level shifter circuit 400 may include aspects similar or identical to those described above with reference to level shifter circuit 300.

Level shifter circuit 400 is a nonlimiting example of level shifter circuit 200, and includes first stage input portion 410, first stage output portion 420, second stage input portion 430, second stage output portion 440, and second stage buffering portion 450.

First stage input portion 410 includes switches which receive an input signal at input nodes 412 and 414 from, for example, a controller, such as controller 110. In alternative embodiments, node 416 is connected to node 414, and the input signal from the controller is single ended. In the illustrated embodiment, the switches of first stage input portion 410 are low voltage switches.

The input signal at nodes 412 and 414 may have a first voltage range, between voltage VinLo and voltage VinHI, such as from 0 V to 1 V, or another voltage range. Based on the input signal, first stage input portion 410 generates signals for first stage output portion 420 at nodes 416 and 418, where the signals for first stage output portion 420 may also have the first voltage range. In some embodiments, the signals for the first stage output portion 420 have a different voltage range.

In some embodiments, first stage input portion 410 is inverting, such that the output signal and the input signal have opposite polarity. In some embodiments, first stage input portion is noninverting, such that the input signal and the output signal have the same polarity.

First stage output portion 420 includes switches which receive an input signal at input nodes 416 and 418 from first stage input portion 410. In some embodiments, the switches of first stage output portion 420 include low voltage switches. In some embodiments, the switches of first stage output portion 420 include medium voltage switches. In some embodiments, all of the switches of first stage output portion 420 are high voltage switches. In some embodiments, the switches of first stage output portion 420 include high voltage switches.

In the illustrated embodiment, the input signal at nodes 416 and 418 may have the first voltage range, such as from 0 V to 1 V, or another voltage range. Based on the input signal at nodes 416 and 418, first stage output portion 420 generates signals for second stage input portion 430 at nodes 426 and 428, where the signals for second stage input portion 430 may have a second voltage range between voltage VinLO and voltage VinterHI, which is different from the first voltage range. For example, the signals for the second stage input portion 430 have a range greater than the first voltage range, such as from 0 V to 4 V, or another voltage range.

In some embodiments, first stage output portion 420 is inverting, such that the output signal and the input signal have opposite polarity. In some embodiments, first stage output portion 420 is noninverting, such that the input signal and the output signal have the same polarity.

Second stage input portion 430 includes switches which receive an input signal at input nodes 426 and 428 from first stage output portion 420. In some embodiments, the switches of second stage input portion 430 include low voltage switches. In some embodiments, the switches of second stage input portion 430 include medium voltage switches. In some embodiments, all of the switches of second stage input portion 430 are medium voltage switches. In some embodiments, the switches of second stage input portion 430 include high voltage switches.

Based on the input signal at nodes 426 and 428, second stage input portion 430 generates signals for second stage output portion 440 at nodes 436 and 438. The signals for second stage output portion 440 may have a third voltage range between voltage VinterLO and voltage VinterHI, which is different from the voltage range of the input signal at nodes 426 and 428. In some embodiments, the third voltage range is the same as the voltage range of the input signal at nodes 426 and 428. For example, the signals for the second stage output portion 440 have a range greater than the first voltage range, such as a voltage range equal to the second voltage range. In some embodiments, the signals for the second stage output portion 440 have a voltage range, such as from 0 V to 2 V, or another voltage range. In some embodiments, the signals for the second stage output portion 440 have a third voltage range different from the first and second voltage ranges, such as from 2 V to 4 V, or another voltage range.

In some embodiments, second stage input portion 430 is inverting, such that the output signal and the input signal have opposite polarity. In some embodiments, first stage input portion 430 is noninverting, such that the input signal and the output signal have the same polarity.

Second stage output portion 440 includes switches which receive an input signal at input nodes 436 and 438 from second stage input portion 430. In some embodiments, the switches of second stage output portion 440 include low voltage switches. In some embodiments, the switches of second stage output portion 440 include medium voltage switches. In some embodiments, all of the switches of second stage output portion 440 are medium voltage switches. In some embodiments, the switches of second stage output portion 440 include high voltage switches. In some embodiments, the switches of second stage output portion 440 include more than one of low voltage switches, medium voltage switches, and high voltage switches, for example, as illustrated.

Based on the input signal at nodes 436 and 438, second stage output portion 440 generates signals for second stage buffer portion 450 at nodes 446 and 448. The signals for second stage buffer portion 450 may have a fourth voltage range between voltage VinterLO and voltage VoutHI, which is, for example, different from the voltage range of the input signal at nodes 436 and 438. For example, the signals for the second stage buffer portion 450 have a range greater than the voltage range of the input signal as nodes 436 and 438. In some embodiments, the signals for the second stage buffer portion 450 have a voltage range from 2 V to 5 V, or another voltage range.

In some embodiments, second stage output portion 440 is inverting, such that the output signal and the input signal have opposite polarity. In some embodiments, first stage output portion 440 is noninverting, such that the input signal and the output signal have the same polarity.

Second stage buffer portion 450 includes switches which receive an input signal at input nodes 446 and 448 from second stage output portion 440. In some embodiments, the switches of second stage buffer portion 450 include low voltage switches. In some embodiments, the switches of second stage buffer portion 450 include medium voltage switches. In some embodiments, the switches of second stage buffer portion 450 include high voltage switches. In some embodiments, all of the switches of second stage buffer portion 450 are high voltage switches.

Based on the input signal at nodes 446 and 448, second stage buffer portion 450 generates the output signals of level shifter circuit 400 at nodes 456 and 458. The output signals for level shifter circuit 400 may have a fifth voltage range between voltage VoutLO and voltage VoutHI, which is, for example, the same as the voltage range of the input signal at nodes 446 and 448. In some embodiments, the output signals for the level shifter circuit 400 have a voltage range from 2 V to 5 V, or another voltage range. In some embodiments, the output signals for level shifter circuit 400 may have a fifth voltage range which is different from the voltage range of the input signal at nodes 446 and 448.

In some embodiments, second stage buffer portion 450 is inverting, such that the output signal and the input signal have opposite polarity. In some embodiments, first stage output 450 portion is noninverting, such that the input signal and the output signal have the same polarity.

The following examples of configurations and relationships between various voltages may be used, for example, to ensure or maximize functionality while preventing or minimizing voltage stress or overstress of the various transistors.

In some embodiments, voltage VcascN1 may be connected to or is otherwise the same as or is substantially the same as voltage VinHI. In some embodiments, voltage VcascN1 is less than voltage VinHI+Vgs threshold voltages of switches N4d and N5d to limit leakage, for example, if using first stage input portion 410. In some embodiments, voltage VcascN1 is less than the maximum voltage allowed for a low voltage switch+the Vgs threshold voltages of switches N4d and N5d. In some embodiments, voltage VcascN1 is greater than voltage VcascN2−the Vgs threshold of switches N4u and N5u+the maximum voltage allowed for a medium voltage switch. In some embodiments, voltage VcascN2 is the average of voltage VinterHI and voltage VinLO. In some embodiments, voltage VcascN2 is less than voltage VinLO+the maximum voltage allowed for a medium voltage switch. In some embodiments, voltage VcascN2 is greater than voltage VinterHI−the maximum voltage allowed for a medium voltage switch.

In some embodiments, when voltage VinterHI−voltage VinHI is not greater than the maximum voltage allowed for a medium voltage switch, cascode switches N4u and N5u are omitted. In some embodiments, voltage VcascN2 may be connected to or is otherwise the same as or is substantially the same as voltage VinHI. In some embodiments, voltage VcascN2 is less than voltage VinHI+Vgs threshold voltages of switches N4d and N5d to limit leakage, for example, if using first stage input portion 410. In some embodiments, voltage VcascN1 is less than the maximum voltage allowed for a low voltage switch+the Vgs threshold voltages of switches N4d and N5d. In some embodiments, voltage VcascN2 is the average of voltage VinterHI and voltage VinLO. In some embodiments, voltage VcascN2 is less than voltage VinLO+the maximum voltage allowed for a medium voltage switch. In some embodiments, voltage VcascN2 is greater than voltage VinterHI−the maximum voltage allowed for a medium voltage switch.

In some embodiments, voltage VcascP may be equal to voltage VoutLO. In some embodiments, voltage VcascP is reduced, for example, to improve switching speed. In some embodiments, voltage VcascP is greater than voltage VinterHI–the maximum voltage allowed for medium voltage switches.

In some embodiments, switches N3d and N2d are omitted. In some embodiments, switches N3d and N2d area used, for example, to limit leakage if the gate voltages of switches N3u and N2u are not sufficiently discharged enough (e.g., equal or less than voltage VinterLO).

In some embodiments, voltage VinterLO may be connected to or is otherwise the same as or is substantially the same as voltage VoutLO. In some embodiments, voltage VinterLO is less than voltage VoutLO+the Vgs threshold voltages of buffer switches N8 and N9, for example, to limit leakage. In some embodiments, voltage VinterLO is greater than voltage VoutHI–maximum voltage allowed on high voltage switches.

In some embodiments, the cascode voltage VcascN3 is equal to the voltage VinterHI. In some embodiments, the cascode voltage VcascN3 is less than the voltage VinterHI+the Vgs threshold voltages of cascode switches N6 and N7, for example, to limit leakage. In some embodiments, the cascode voltage VcascN3 is greater than the voltage VinterLO+the Vgs threshold voltages of switches N2 and N3+an overdrive margin voltage for switches N2 and N3. In some embodiments, the overdrive margin voltage is sufficient to cause switches N2 and N3 to be conductive enough to discharge nodes 436 and 438.

In some embodiments, switches P3 and P2 are omitted. When used, switches P3 and P2 may increase speed by increasing the voltages at nodes 436 and 438, and may reduce the drain-source voltages of switches N6 and N7. In embodiments with voltage VoutHI not always greater than voltage VinterHI, switches P2 and P3 may be omitted, for example, to avoid leakage from voltage VinterHI to voltage VoutHI or from voltage VoutHI to voltage VinterHI through cascode switches N6 and N7.

In some embodiments, one of outputs VOUT and VOUT_N is not needed, and either switches N9 and P11 are omitted or switches N8 and P10 are omitted, for example, to save area and improve speed.

In some embodiments, switches PL1 and PL2 are omitted. When used, switches PL1 and PL2 increase speed by increasing the voltages at nodes 416 and 418. In embodiments with voltage VinterHI not always greater than voltage VinHI, switches P may be omitted, for example, to avoid leakage from voltage VinterHI to voltage VinHI or from voltage VinHI to voltage VinterHI through cascode switches N4u, N4d, N4u, and N5d.

Figure 5:
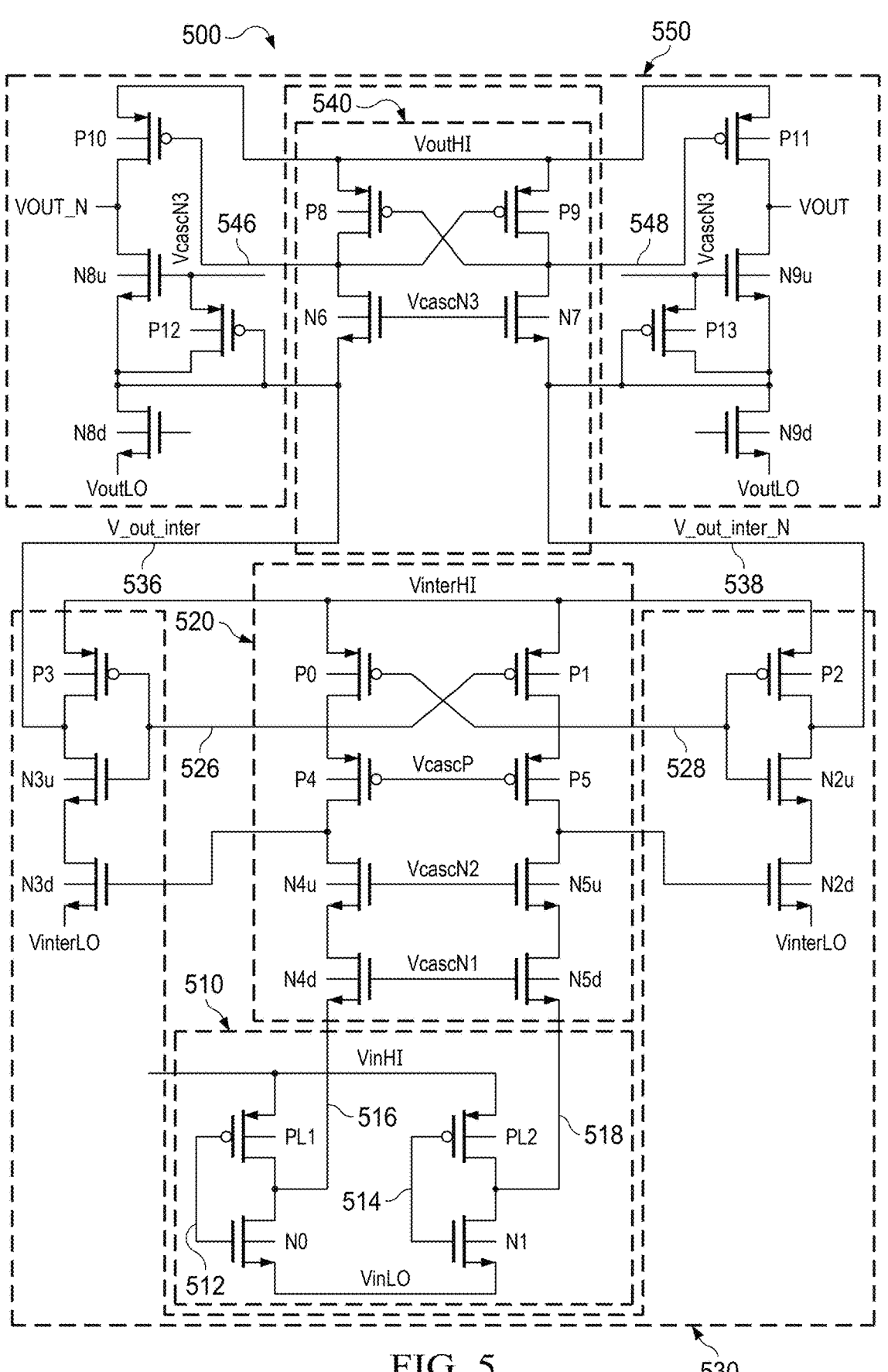
FIG. 5 shows a schematic circuit diagram of a level shifter circuit according to some embodiments.

FIG. 5 shows a schematic circuit diagram of a level shifter circuit 500 according to some embodiments. Level shifter circuit 500 may include aspects similar or identical to those described above with reference to level shifter circuit 300 and/or with reference to level shifter circuit 400.

Level shifter circuit 500 is a nonlimiting example of level shifter circuit 200, and includes first stage input portion 510, first stage output portion 520, second stage input portion 530, second stage output portion 540, and second stage buffering portion 550.

First stage input portion 510 includes switches which receive an input signal at input nodes 512 and 514 from, for example, a controller, such as controller 110. In the illustrated embodiment, the switches of first stage input portion 510 are low voltage switches. In alternative embodiments, node 516 is connected to node 514, and the input signal from the controller is single ended.

The input signal at nodes 512 and 514 may have a first voltage range, between voltage VinLo and voltage VinHI, such as from 0 V to 1 V, or another voltage range. Based on the input signal, first stage input portion 510 generates signals for first stage output portion 520 at nodes 516 and 518, where the signals for first stage output portion 520 may also have the first voltage range. In some embodiments, the signals for the first stage output portion 520 have a different voltage range.

In some embodiments, first stage input portion 510 is inverting, such that the output signal and the input signal have opposite polarity. In some embodiments, first stage input portion is noninverting, such that the input signal and the output signal have the same polarity.

First stage output portion 520 includes switches which receive an input signal at input nodes 516 and 518 from first stage input portion 510. In some embodiments, the switches of first stage output portion 520 include low voltage switches. In some embodiments, the switches of first stage output portion 520 include medium voltage switches. In some embodiments, the switches of first stage output portion 520 include high voltage switches. In some embodiments, the switches of first stage output portion 520 include more than one of low voltage switches, medium voltage switches, and high voltage switches, for example, as illustrated.

In the illustrated embodiment, the input signal at nodes 516 and 518 may have the first voltage range, such as from 0 V to 1 V, or another voltage range. Based on the input signal at nodes 516 and 518, first stage output portion 520 generates signals for second stage input portion 530 at nodes 526 and 528, where the signals for second stage input portion 530 may have a second voltage range between voltage VinLO and voltage VinterHI, which is different from the first voltage range. For example, the signals for the second stage input portion 530 have a range greater than the first voltage range, such as from 0 V to 4V, or another voltage range.

In some embodiments, first stage output portion 520 is inverting, such that the output signal and the input signal have opposite polarity. In some embodiments, first stage output portion 520 is noninverting, such that the input signal and the output signal have the same polarity.

Second stage input portion 530 includes switches which receive an input signal at input nodes 526 and 528 from first stage output portion 520. In some embodiments, the switches of second stage input portion 530 include low voltage switches. In some embodiments, the switches of second stage input portion 530 include medium voltage switches. In some embodiments, all of the switches of second stage input portion 530 are medium voltage switches. In some embodiments, the switches of second stage input portion 530 include low voltage switches and medium voltage switches. In some embodiments, the switches of second stage input portion 530 include high voltage switches.

Based on the input signal at nodes 526 and 528, second stage input portion 530 generates signals for second stage output portion 540 at nodes 536 and 538. The signals for second stage output portion 540 may have a third voltage range between voltage VinterLO and voltage VinterHI, which is different from the voltage range of the input signal at nodes 526 and 528. In some embodiments, the third voltage range is the same as the voltage range of the input signal at nodes 526 and 528. For example, the signals for the second stage output portion 540 have a range greater than the first voltage range, such as a voltage range equal to the second voltage range. In some embodiments, the signals for the second stage output portion 540 have a voltage range, such as from 0 V to 2 V, or another voltage range. In some embodiments, the signals for the second stage output portion 540 have a third voltage range different from the first and second voltage ranges, such as from 2 V to 4 V, or another voltage range.

In some embodiments, second stage input portion 530 is inverting, such that the output signal and the input signal have opposite polarity. In some embodiments, second stage input portion 530 is noninverting, such that the input signal and the output signal have the same polarity.

Second stage output portion 540 includes switches which receive an input signal at input nodes 536 and 538 from second stage input portion 530. In some embodiments, the switches of second stage output portion 540 include low voltage switches. In some embodiments, the switches of second stage output portion 540 include medium voltage switches. In some embodiments, the switches of second stage output portion 540 include high voltage switches. In some embodiments, the switches of second stage output portion 540 include more than one of low voltage switches, medium voltage switches, and high voltage switches, for example, as illustrated.

Based on the input signal at nodes 536 and 538, second stage output portion 540 generates signals for second stage buffer portion 550 at nodes 546 and 548. The signals for second stage buffer portion 550 may have a fourth voltage range between voltage VinterLO and voltage VoutHI, which is, for example, different from the voltage range of the input signal at nodes 536 and 538. For example, the signals for the second stage buffer portion 550 have a range greater than the voltage range of the input signal as nodes 536 and 538. In some embodiments, the signals for the second stage buffer portion 550 have a voltage range from 2 V to 5 V, or another voltage range.

In some embodiments, second stage output portion 540 is inverting, such that the output signal and the input signal have opposite polarity. In some embodiments, second stage output portion 540 is noninverting, such that the input signal and the output signal have the same polarity.

Second stage buffer portion 550 includes switches which receive an input signal at input nodes 546 and 548 from second stage output portion 540. In some embodiments, the switches of second stage buffer portion 550 include low voltage switches. In some embodiments, the switches of second stage buffer portion 550 include medium voltage switches. In some embodiments, the switches of second stage buffer portion 550 include high voltage switches. In some embodiments, the switches of second stage buffer portion 550 include more than one of low voltage switches, medium voltage switches, and high voltage switches, for example, as illustrated.

Based on the input signal at nodes 546 and 548, second stage buffer portion 550 generates the output signals of level shifter circuit 500 at nodes 556 and 558. The output signals for level shifter circuit 500 may have a fifth voltage range between voltage VoutLO and voltage VoutHI, which is, for example, the same as the voltage range of the input signal at nodes 546 and 548. In some embodiments, the output signals for the level shifter circuit 500 have a voltage range from 2 V to 5 V, or another voltage range. In some embodiments, the output signals for level shifter circuit 500 may have a fifth voltage range which is different from the voltage range of the input signal at nodes 546 and 548.

In some embodiments, second stage buffer portion 550 is inverting, such that the output signal and the input signal have opposite polarity. In some embodiments, first stage buffer portion 550 portion is noninverting, such that the input signal and the output signal have the same polarity.

The following examples of configurations and relationships between various voltages may be used, for example, to ensure or maximize functionality while preventing or minimizing voltage stress or overstress of the various transistors.

In some embodiments, voltage VcascN1 may be connected to or is otherwise the same as or is substantially the same as voltage VinHI. In some embodiments, voltage VcascN1 is less than voltage VinHI+Vgs threshold voltages of switches N4d and N5d to limit leakage, for example, if using first stage input portion 510. In some embodiments, voltage VcascN1 is less than the maximum voltage allowed for a low voltage switch+the Vgs threshold voltages of switches N4d and N5d. In some embodiments, voltage VcascN1 is greater than voltage VcascN2–the Vgs threshold of switches N4u and N5u+the maximum voltage allowed for a medium voltage switch. In some embodiments, voltage VcascN2 is the average of voltage VinterHI and voltage VinLO. In some embodiments, voltage VcascN2 is less than voltage VinLO+the maximum voltage allowed for a medium voltage switch. In some embodiments, voltage VcascN2 is greater than voltage VinterHI–the maximum voltage allowed for a medium voltage switch.

In some embodiments, when voltage VinterHI–voltage VinHI is not greater than the maximum voltage allowed for a medium voltage switch, cascode switches N4u and N5u are omitted. In some embodiments, voltage VcascN2 may be connected to or is otherwise the same as or is substantially the same as voltage VinHI. In some embodiments, voltage VcascN2 is less than voltage VinHI+Vgs threshold voltages of switches N4d and N5d to limit leakage, for example, if using first stage input portion 510. In some embodiments, voltage VcascN1 is less than the maximum voltage allowed for a low voltage switch+the Vgs threshold voltages of switches N4d and N5d. In some embodiments, voltage VcascN2 is the average of voltage VinterHI and voltage VinLO. In some embodiments, voltage VcascN2 is less than voltage VinLO+the maximum voltage allowed for a medium voltage switch. In some embodiments, voltage VcascN2 is greater than voltage VinterHI–the maximum voltage allowed for a medium voltage switch.

In some embodiments, voltage VcascP may be equal to voltage VoutLO. In some embodiments, voltage VcascP is reduced, for example, to improve switching speed. In some embodiments, voltage VcascP is greater than voltage VinterHI–the maximum voltage allowed for medium voltage switches.

In some embodiments, switches N3d and N2d are omitted. In some embodiments, switches N3d and N2d area used, for example, to limit leakage if the gate voltages of switches Nu and N2u are not sufficiently discharged enough (e.g., equal or less than voltage VinterLO).

In some embodiments, voltage VinterLO may be connected to or is otherwise the same as or is substantially the same as voltage VoutLO. In some embodiments, voltage VinterLO is less than voltage VoutLO+the Vgs threshold voltages of buffer switches N8 and N9, for example, to limit leakage. In some embodiments, voltage VinterLO is greater than voltage VoutHI–maximum voltage allowed on high voltage switches.

In some embodiments, the cascode voltage VcascN3 is equal to the voltage VinterHI. In some embodiments, the cascode voltage VcascN3 is less than the voltage VinterHI+ the Vgs threshold voltages of cascode switches N6 and N7, for example, to limit leakage. In some embodiments, the cascode voltage VcascN3 is greater than the voltage VinterLO+the Vgs threshold voltages of switches N2 and N3+an overdrive margin voltage for switches N2 and N3. In some embodiments, the overdrive margin voltage is sufficient to cause switches N2 and N3 to be conductive enough to discharge nodes 536 and 538.

In some embodiments, switches P3 and P2 are omitted. When used, switches P3 and P2 may increase speed by increasing the voltages at nodes 536 and 538, and may reduce the drain-source voltages of switches N6 and N7. In embodiments with voltage VoutHI not always greater than voltage VinterHI, switches P2 and P3 may be omitted, for example, to avoid leakage from voltage VinterHI to voltage VoutHI or from voltage VoutHI to voltage VinterHI through cascode switches N6 and N7.

In some embodiments, switches P12 and P13 are omitted. In some embodiments, switches P12 and P13 are used, for example, to speed switching of the sources of switches N8$u$ and Nou, and/or to reduce the drain source voltages of switches N8$u$ and Nou.

In some embodiments, switches PL1 and PL2 are omitted. When used, switches PL1 and PL2 increase speed by increasing the voltages at nodes 516 and 518. In embodiments with voltage VinterHI not always greater than voltage VinHI, switches P may be omitted, for example, to avoid leakage from voltage VinterHI to voltage VinHI or from voltage VinHI to voltage VinterHI through cascode switches N4$u$, N4$d$, N4$u$, and N5$d$.

In some embodiments, one of outputs VOUT and VOUT_N is not needed, and either switches N9 and P11 are omitted or switches N8 and P10 are omitted, for example, to save area and improve speed.

In some embodiments, voltage VcascN2 is less than the Vgs threshold voltages of switches N4$u$ and N5$u$+voltage VinHI+the maximum voltage allowed on low voltage switches, for example, in embodiments using first stage input portion 510.

In some embodiments, voltage VcascN2 is less than the Vgs threshold voltages of switches N4$u$ and N5$u$+2×the maximum voltage allowed on low voltage switches, for example, in embodiments omitting switches P in first stage input portion 510.

In some embodiments, voltage VcascN1 may be connected to or is otherwise the same as or is substantially the same as voltage VinHI. In some embodiments, voltage VcascN1 is less than the Vgs voltage threshold of switches N4$d$ and N5$d$+voltage VinHI, for example, in embodiments using first stage input portion 510.

In some embodiments, voltage VcascN1 is less than the Vgs voltage threshold of switches N4$d$ and N5$d$+the maximum allowed voltage for low voltage switches, for example, in embodiments omitting switches P in first stage input portion 510.

Figure 6:
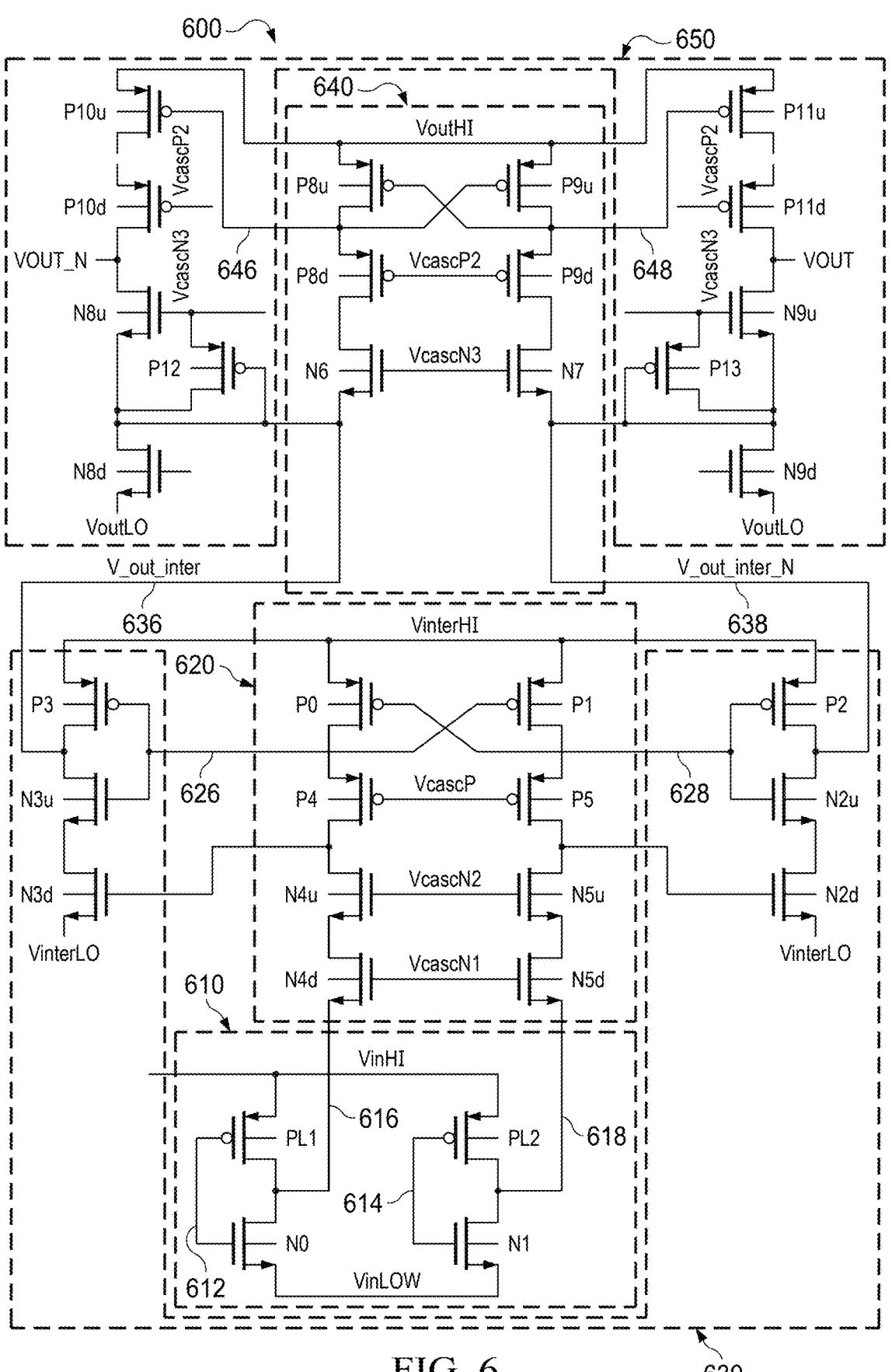
FIG. 6 shows a schematic circuit diagram of a level shifter circuit according to some embodiments.

FIG. 6 shows a schematic circuit diagram of a level shifter circuit 600 according to some embodiments. Level shifter circuit 600 may include aspects similar or identical to those described above with reference to level shifter circuits 300, 400, and/or 500.

Level shifter circuit 600 is a nonlimiting example of level shifter circuit 200, and includes first stage input portion 610, first stage output portion 620, second stage input portion 630, second stage output portion 640, and second stage buffering portion 650.

First stage input portion 610 has aspects similar or identical to those described above with reference to first stage input portion 510. First stage output portion 620 has aspects similar or identical to those described above with reference to first stage output portion 520. Second stage input portion 630 has aspects similar or identical to those described above with reference to second stage input portion 530.

Second stage output portion 640 includes switches which receive an input signal at input nodes 636 and 638 from second stage input portion 630. In some embodiments, the switches of second stage output portion 640 include low voltage switches. In some embodiments, all of the switches of second stage output portion 640 are low voltage switches. In some embodiments, the switches of second stage output portion 640 include medium voltage switches. In some embodiments, the switches of second stage output portion 640 include high voltage switches. In some embodiments, the switches of second stage output portion 640 include more than one of low voltage switches, medium voltage switches, and high voltage switches, for example, as illustrated.

Based on the input signal at nodes 636 and 638, second stage output portion 640 generates signals for second stage buffer portion 650 at nodes 646 and 648. The signals for second stage buffer portion 650 may have a fourth voltage range between voltage VinterLO and voltage VoutHI, which is, for example, different from the voltage range of the input signal at nodes 636 and 638. For example, the signals for the second stage buffer portion 650 have a range greater than the voltage range of the input signal as nodes 636 and 638. In some embodiments, the signals for the second stage buffer portion 650 have a voltage range from 2 V to 5 V, or another voltage range.

In some embodiments, second stage output portion 640 is inverting, such that the output signal and the input signal have opposite polarity. In some embodiments, second stage output portion 640 is noninverting, such that the input signal and the output signal have the same polarity.

Second stage buffer portion 650 includes switches which receive an input signal at input nodes 646 and 648 from second stage output portion 640. In some embodiments, the switches of second stage buffer portion 650 include low voltage switches. In some embodiments, all of the switches of second stage buffer portion 650 are low voltage switches. In some embodiments, the switches of second stage buffer portion 650 include medium voltage switches. In some embodiments, the switches of second stage buffer portion 650 include high voltage switches. In some embodiments, the switches of second stage buffer portion 650 include more than one of low voltage switches, medium voltage switches, and high voltage switches, for example, as illustrated.

Based on the input signal at nodes 646 and 648, second stage buffer portion 650 generates the output signals of level shifter circuit 600 at nodes 656 and 658. The output signals for level shifter circuit 600 may have a fifth voltage range between voltage VoutLO and voltage VoutHI, which is, for example, the same as the voltage range of the input signal at nodes 646 and 648. In some embodiments, the output signals for the level shifter circuit 600 have a voltage range from 2 V to 5 V, or another voltage range. In some embodiments, the output signals for level shifter circuit 600 may have a fifth voltage range which is different from the voltage range of the input signal at nodes 646 and 648.

In some embodiments, second stage buffer portion 650 is inverting, such that the output signal and the input signal have opposite polarity. In some embodiments, second stage buffer portion 650 is noninverting, such that the input signal and the output signal have the same polarity.

The following examples of configurations and relationships between various voltages may be used, for example, to ensure or maximize functionality while preventing or minimizing voltage stress or overstress of the various transistors.

In some embodiments, voltage VcascN1 may be connected to or is otherwise the same as or is substantially the same as voltage VinHI. In some embodiments, voltage VcascN1 is less than voltage VinHI+Vgs threshold voltages of switches N4d and N5d to limit leakage, for example, if using first stage input portion 610. In some embodiments, voltage VcascN1 is less than the maximum voltage allowed for a low voltage switch+the Vgs threshold voltages of switches N4d and N5d. In some embodiments, voltage VcascN1 is greater than voltage VcascN2−the Vgs threshold of switches N4u and N5u+the maximum voltage allowed for a medium voltage switch. In some embodiments, voltage VcascN2 is the average of voltage VinterHI and voltage VinLO. In some embodiments, voltage VcascN2 is less than voltage VinLO+the maximum voltage allowed for a medium voltage switch. In some embodiments, voltage VcascN2 is greater than voltage VinterHI−the maximum voltage allowed for a medium voltage switch.

In some embodiments, when voltage VinterHI-voltage VinHI is not greater than the maximum voltage allowed for a medium voltage switch, cascode switches N4u and N5u are omitted. In some embodiments, voltage VcascN2 may be connected to or is otherwise the same as or is substantially the same as voltage VinHI. In some embodiments, voltage VcascN2 is less than voltage VinHI+Vgs threshold voltages of switches N4d and N5d to limit leakage, for example, if using first stage input portion 610. In some embodiments, voltage VcascN1 is less than the maximum voltage allowed for a low voltage switch+the Vgs threshold voltages of switches N4d and N5d. In some embodiments, voltage VcascN2 is the average of voltage VinterHI and voltage VinLO. In some embodiments, voltage VcascN2 is less than voltage VinLO+the maximum voltage allowed for a medium voltage switch. In some embodiments, voltage VcascN2 is greater than voltage VinterHI−the maximum voltage allowed for a medium voltage switch.

In some embodiments, voltage VcascP may be equal to voltage VoutLO. In some embodiments, voltage VcascP is reduced, for example, to improve switching speed. In some embodiments, voltage VcascP is greater than voltage VinterHI−the maximum voltage allowed for medium voltage switches.

In some embodiments, switches N3d and N2d are omitted. In some embodiments, switches N3d and N2d area used, for example, to limit leakage if the gate voltages of switches N3u and N2u are not sufficiently discharged enough (e.g., equal or less than voltage VinterLO).

In some embodiments, voltage VinterLO may be connected to or is otherwise the same as or is substantially the same as voltage VoutLO. In some embodiments, voltage VinterLO is less than voltage VoutLO+the Vgs threshold voltages of buffer switches N8 and N9, for example, to limit leakage. In some embodiments, voltage VinterLO is greater than voltage VoutHI−maximum voltage allowed on high voltage switches.

In some embodiments, the cascode voltage VcascN3 is equal to the voltage VinterHI. In some embodiments, the cascode voltage VcascN3 is less than the voltage VinterHI+ the Vgs threshold voltages of cascode switches N6 and N7, for example, to limit leakage. In some embodiments, the cascode voltage VcascN3 is greater than the voltage VinterLO+the Vgs threshold voltages of switches N2 and N3+an overdrive margin voltage for switches N2 and N3. In some embodiments, the overdrive margin voltage is sufficient to cause switches N2 and N3 to be conductive enough to discharge nodes 636 and 638.

In some embodiments, switches P3 and P2 are omitted. When used, switches P3 and P2 may increase speed by increasing the voltages at nodes 636 and 638, and may reduce the drain-source voltages of switches N6 and N7. In embodiments with voltage VoutHI not always greater than voltage VinterHI, switches P2 and P3 may be omitted, for example, to avoid leakage from voltage VinterHI to voltage VoutHI or from voltage VoutHI to voltage VinterHI through cascode switches N6 and N7.

In some embodiments, switches P12 and P13 are omitted. In some embodiments, switches P12 and P13 are used, for example, to speed switching of the sources of switches N8u and Nou, and/or to reduce the drain source voltages of switches N8u and Nou.

In some embodiments, switches P are omitted. When used, switches P2 increase speed by increasing the voltages at nodes 616 and 618. In embodiments with voltage VinterHI not always greater than voltage VinHI, switches P may be omitted, for example, to avoid leakage from voltage VinterHI to voltage VinHI or from voltage VinHI to voltage VinterHI through cascode switches N4u, N4d, N4u, and N5d.

In some embodiments, one of outputs VOUT and VOUT_N is not needed, and either switches N9 and P11 are omitted or switches N8 and P10 are omitted, for example, to save area and improve speed.

In some embodiments, voltage VcascN2 is less than the Vgs threshold voltages of switches N4u and N5u+voltage VinHI+the maximum voltage allowed on low voltage switches, for example, in embodiments using first stage input portion 610.

In some embodiments, voltage VcascN2 is less than the Vgs threshold voltages of switches N4u and N5u+2×the maximum voltage allowed on low voltage switches, for example, in embodiments omitting switches P in first stage input portion 610.

In some embodiments, voltage VcascN1 may be connected to or is otherwise the same as or is substantially the same as voltage VinHI. In some embodiments, voltage VcascN1 is less than the Vgs voltage threshold of switches N4d and N5d+voltage VinHI, for example, in embodiments using first stage input portion 610.

In some embodiments, voltage VcascN1 is less than the Vgs voltage threshold of switches N4d and N5d+the maximum allowed voltage for low voltage switches, for example, in embodiments omitting switches P in first stage input portion 610.

In some embodiments, voltage VcascP2 may be equal to voltage VoutHI−the maximum voltage allowed for medium voltage switches. In some embodiments, voltage VcascP2 is reduced, for example, to improve switching speed.

Figure 7:
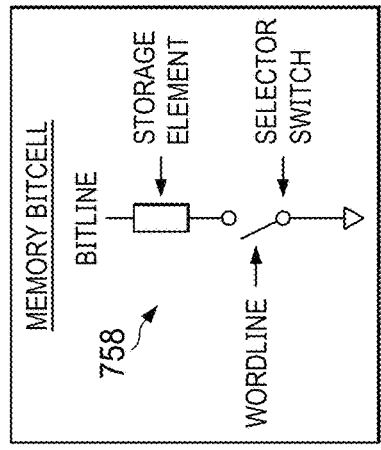
FIG. 7 shows a schematic circuit diagram of an electronic system according to some embodiments.

FIG. 7 shows a schematic circuit diagram of an electronic system 700 having a level shifting circuit 720 according to some embodiments. In the illustrated embodiment, electronic system 700 is a memory system 700 including a controller 710, level shifting circuit 720, and a controlled circuit, which is a switch array 730, i.e., an array of switches. Memory system 700 also includes bitline driver and sense circuitry 740, and memory array 750. Other electronic systems may use level shifter circuits having properties similar or identical to those of level shifting circuit 720.

Memory array 750 includes an array of memory bit cells 758. The illustrated bit cell 758 is an example and is not meant to be limiting. Each bit cell 758 is located at or near an intersection 756 of a particular bit line 752 of bit lines 752 and a particular word line 754 of word lines 754.

Bit line driver and sense circuitry 740 is used to store data in those memory bit cells 758 connected thereto by the switch array 730. In addition, bit line driver and sense circuitry 740 may be used to retrieve data from those memory bit cells 758 connected thereto by the switch array 730. Which memory bit cells 758 are connected to bit line driver and sense circuitry 740 is determined by control signals generated by controller 710.

Controller 710 generates the control switches signals for switch array 730 using, for example, low voltage switches, where the control signals generated by controller 710 have a lower level voltage range, such as from 0 V to 1 V, or another voltage range.

Switch array 730 performs its switching functions using circuits having, for example, high voltage switches which generate or conduct signals having a higher voltage range, such as from 2 V to 5 V, or another voltage range. In addition, switch array 730 generates or conducts the signals in response to input control signals having the higher voltage range.

Level shifting circuit 720 includes one or more level shifter circuits, examples of which are described elsewhere herein. The level shifting circuit 720 receives the lower voltage control signals from controller 710 and generates the higher voltage control signals for switch array 730. In response to the higher voltage control signals the switches of switch array 730 selectively connect and disconnect the bit line 752 of memory array 750 to and from bit line driver and sense circuitry 740.

Figure 8:
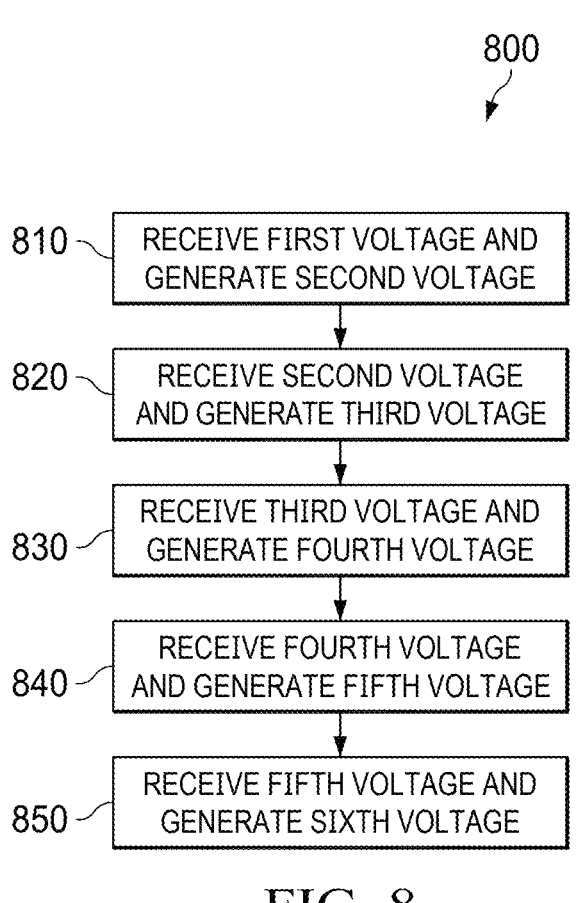
FIG. 8 shows a flowchart diagram of a method of using an electronic system according to some embodiments.

FIG. 8 shows a flowchart diagram of a method 800 of using an electronic system according to some embodiments. The method 800 may be performed, for example, by electronic system hundred or 700 or by any of the level shifter circuits described.

At 810, a first circuit receives a first voltage and generates a second voltage. In some embodiments, the second voltage varies between a VinLO low voltage (e.g., 0 V) and a VinHI high voltage (e.g., 1 V). In some embodiments, the first circuit comprises a plurality of low voltage threshold switches.

At 820, a second circuit receives the second voltage and generates a third voltage. In some embodiments, the third voltage varies between the VinLO low voltage and a VinterHI high voltage (e.g., 4 V). In some embodiments, the second circuit comprises a plurality of high voltage threshold switches. In some embodiments, the second circuit comprises a plurality of medium voltage threshold switches.

At 830, a third circuit receives the third voltage generates a fourth voltage. In some embodiments, the fourth voltage varies between a VinterLO low voltage and the VinterHI high voltage (e.g., 2 V to 4 V, or another voltage range). In some embodiments, the third circuit comprises a plurality of high voltage threshold switches. In some embodiments, the third circuit comprises a plurality of medium voltage threshold switches.

At 840, a fourth circuit receives the fourth voltage and generate a fifth voltage, wherein the fifth voltage varies between the VinterLO voltage and a VoutHI high voltage (e.g., 5 V). In some embodiments, the fourth circuit comprises a plurality of high voltage threshold switches. In some embodiments, the fourth circuit comprises a plurality of medium voltage threshold switches. In some embodiments, the fourth circuit comprises a plurality of high voltage threshold switches and a plurality of medium voltage threshold switches.

At 850, a fifth circuit receives the fifth voltage and generates a sixth voltage. In some embodiments, the sixth voltage varies between a VoutLO low voltage and the VoutHI high voltage (e.g., 2 V to 5 V, or another voltage range). In some embodiments, the fifth circuit comprises a plurality of high voltage threshold switches. In some embodiments, the fifth circuit comprises a plurality of medium voltage threshold switches. In some embodiments, the fifth circuit comprises a plurality of high voltage threshold switches and a plurality of medium voltage threshold switches.

Examples of the present invention are summarized here. Other examples can also be understood from the entirety of the specification and the claims filed herein.

Example 1. One embodiment is a level shifter circuit, including a first stage input circuit configured to receive an input voltage and generate a second voltage, where the second voltage varies between a first low voltage and a first high voltage, and where the first stage input circuit includes a plurality of low voltage threshold switches. The level shifter also includes a first stage output circuit configured to receive the second voltage and to generate a third voltage, where the third voltage varies between the first low voltage and a second high voltage, and where the first stage output circuit includes a first plurality of medium voltage switches. The level shifter also includes a second stage input circuit configured to receive the third voltage and to generate a fourth voltage, where the fourth voltage varies between a second low voltage and the second high voltage, and where the second stage input circuit includes a second plurality of medium voltage switches. The level shifter also includes a second stage output circuit configured to receive the fourth voltage and generate a fifth voltage, where the fifth voltage varies between the second low voltage and a third high voltage, and where the second stage output circuit includes a third plurality of medium voltage switches. The level shifter also includes a buffering circuit configured to receive the fifth voltage and to generate an output voltage, where the output voltage varies between a third low voltage and the third high voltage.

Example 2. The level shifter circuit of example 1, where the second high voltage is greater than the first low voltage, and where the second high voltage is less than the third high voltage.

Example 3. The level shifter circuit any one of examples 1 or 2, where the second low voltage is greater than the first low voltage.

Example 4. The level shifter circuit any one of examples 1-3, where the second low voltage is equal to the third low voltage.

Example 5. The level shifter circuit any one of examples 1-4, where the first stage output circuit includes a second plurality of low voltage switches.

Example 6. The level shifter circuit any one of examples 1-5, where the first high voltage is greater than the first low voltage and is less than the third high voltage.

Example 7. The level shifter circuit any one of examples 1-6, where the buffering circuit includes a fourth plurality of medium voltage switches.

Example 8. The level shifter circuit any one of examples 1-7, where each of the switches of the level shifter circuit is either a low voltage switch or a medium voltage switch.

Example 9. Another embodiment is another embodiment is an array circuit. The array circuit includes an array of devices, where a plurality of devices of the array each include at least one high voltage switch. The array circuit also includes a controller configured to generate a plurality of first control signals for controlling the array of devices. The array circuit also includes an array of level shifters, each level shifter configured to receive one of the first control signals from the controller as an input voltage, to generate one of a plurality of second control signals as an output voltage, and to provide the output voltage to one of the array of devices. The level shifters each include a first stage input circuit configured to receive the input voltage and generate a second voltage, where the second voltage varies between a first low voltage and a first high voltage, and where the first stage input circuit includes a plurality of low voltage threshold switches. The level shifters also each include a first stage output circuit configured to receive the second voltage and to generate a third voltage, where the third voltage varies between the first low voltage and a second high voltage, and where the first stage output circuit includes a first plurality of medium voltage switches. The level shifters also each include a second stage input circuit configured to receive the third voltage and to generate a fourth voltage, where the fourth voltage varies between a second low voltage and the second high voltage, and where the second stage input circuit includes a second plurality of medium voltage switches. The level shifters also each include a second stage output circuit configured to receive the fourth voltage and generate a fifth voltage, where the fifth voltage varies between the second low voltage and a third high voltage, and where the second stage output circuit includes a third plurality of medium voltage switches. The level shifters also each include a buffering circuit configured to receive the fifth voltage and to generate the output voltage, where the output voltage varies between a third low voltage and the third high voltage.

Example 10. The array circuit of example 9, where the second high voltage is greater than the first low voltage, and where the second high voltage is less than the third high voltage.

Example 11. The array circuit any one of examples 9 or 10, where the second low voltage is greater than the first low voltage.

Example 12. The array circuit any one of examples 9-11, where the second low voltage is equal to the third low voltage.

Example 13. The array circuit any one of examples 9-12, where the first stage output circuit includes a fourth plurality of low voltage switches.

Example 14. The array circuit any one of examples 9-13, where the first high voltage is greater than the first low voltage and is less than the third high voltage.

Example 15. The array circuit any one of examples 9-14, where the buffering circuit includes a plurality of medium voltage switches.

Example 16. The array circuit any one of examples 9-15, where each of the switches of the level shifters is either a low voltage switch or a medium voltage switch.

Example 17. Another embodiment is a method of using a level shifter circuit. The method includes, with a first stage input circuit including a plurality of low voltage threshold switches, receiving an input voltage, and generating a second voltage based in part on the input voltage, where the second voltage varies between a first low voltage and a first high voltage. The method also includes, with a first stage output circuit including a first plurality of medium voltage switches receiving the second voltage, and generating a third voltage based in part on the second voltage, where the third voltage varies between the first low voltage and a second high voltage. The method also includes, with a second stage input circuit including a second plurality of medium voltage switches, receiving the third voltage, and generating a fourth voltage based in part on the third voltage, where the fourth voltage varies between a second low voltage and the second high voltage. The method also includes, with a second stage output circuit including a third plurality of medium voltage switches, receiving the fourth voltage, and generating a fifth voltage based in part on the fourth voltage, where the fifth voltage varies between the second low voltage and a third high voltage. The method also includes, with a buffering circuit receiving the fifth voltage, and generating an output voltage based in part on the fifth voltage, where the output voltage varies between a third low voltage and the third high voltage.

Example 18. The method of example 17, where the second high voltage is greater than the first low voltage, and where the second high voltage is less than the third high voltage.

Example 19. The method any one of examples 17 or 18, where the second low voltage is greater than the first low voltage.

Example 20. The method any one of examples 17-19, where the second low voltage is equal to the third low voltage. While this invention has been described with reference to illustrative implementations, this description is not intended to be construed in a limiting sense. Various modifications and combinations of the illustrative implementations, as well as other implementations of the invention, will be apparent to persons skilled in the art upon reference to the description. It is therefore intended that the appended claims encompass any such modifications or implementations.

What is claimed is:

1. A level shifter circuit, comprising:
a first stage input circuit configured to receive an input voltage and generate a second voltage, wherein the second voltage varies between a first low voltage and a first high voltage, and wherein the first stage input circuit comprises a plurality of low voltage threshold switches;
a first stage output circuit configured to receive the second voltage and to generate a third voltage, wherein the third voltage varies between the first low voltage and a second high voltage, and wherein the first stage output circuit comprises a first plurality of medium voltage switches;
a second stage input circuit configured to receive the third voltage and to generate a fourth voltage, wherein the fourth voltage varies between a second low voltage and the second high voltage, and wherein the second stage input circuit comprises a second plurality of medium voltage switches, wherein the second low voltage is greater than the first low voltage;
a second stage output circuit configured to receive the fourth voltage and generate a fifth voltage, wherein the fifth voltage varies between the second low voltage and a third high voltage, and wherein the second stage output circuit comprises a third plurality of medium voltage switches; and
a buffering circuit configured to receive the fifth voltage and to generate an output voltage, wherein the output voltage varies between a third low voltage and the third high voltage.

2. The level shifter circuit of claim 1, wherein the second high voltage is greater than the first low voltage, and wherein the second high voltage is less than the third high voltage.

3. The level shifter circuit of claim 1, wherein the second low voltage is equal to the third low voltage.

4. The level shifter circuit of claim 1, wherein the first stage output circuit comprises a second plurality of low voltage switches.

5. The level shifter circuit of claim 1, wherein the first high voltage is greater than the first low voltage and is less than the third high voltage.

6. The level shifter circuit of claim 1, wherein the buffering circuit comprises a fourth plurality of medium voltage switches.

7. The level shifter circuit of claim 1, wherein each of the switches of the level shifter circuit is either a low voltage switch or a medium voltage switch.

8. An array circuit, comprising:
an array of devices, wherein a plurality of devices of the array each comprise at least one high voltage switch;
a controller configured to generate a plurality of first control signals for controlling the array of devices; and
an array of level shifters, each level shifter configured to receive one of the first control signals from the controller as an input voltage, to generate one of a plurality of second control signals as an output voltage, and to provide the output voltage to one of the array of devices, wherein the level shifters each comprise:
a first stage input circuit configured to receive the input voltage and generate a second voltage, wherein the second voltage varies between a first low voltage and a first high voltage, and wherein the first stage input circuit comprises a plurality of low voltage threshold switches,
a first stage output circuit configured to receive the second voltage and to generate a third voltage, wherein the third voltage varies between the first low voltage and a second high voltage, and wherein the first stage output circuit comprises a first plurality of medium voltage switches,
a second stage input circuit configured to receive the third voltage and to generate a fourth voltage, wherein the fourth voltage varies between a second low voltage and the second high voltage, and wherein the second stage input circuit comprises a second plurality of medium voltage switches, wherein the second low voltage is greater than the first low voltage,
a second stage output circuit configured to receive the fourth voltage and generate a fifth voltage, wherein the fifth voltage varies between the second low voltage and a third high voltage, and wherein the second stage output circuit comprises a third plurality of medium voltage switches, and
a buffering circuit configured to receive the fifth voltage and to generate the output voltage, wherein the output voltage varies between a third low voltage and the third high voltage.

9. The array circuit of claim 8, wherein the second high voltage is greater than the first low voltage, and wherein the second high voltage is less than the third high voltage.

10. The array circuit of claim 8, wherein the second low voltage is equal to the third low voltage.

11. The array circuit of claim 8, wherein the first stage output circuit comprises a fourth plurality of low voltage switches.

12. The array circuit of claim 8, wherein the first high voltage is greater than the first low voltage and is less than the third high voltage.

13. The array circuit of claim 8, wherein the buffering circuit comprises a plurality of medium voltage switches.

14. The array circuit of claim 8, wherein each switch of each of the level shifters is either a low voltage switch or a medium voltage switch.

15. A method of using a level shifter circuit, the method comprising:
with a first stage input circuit comprising a plurality of low voltage threshold switches:
receiving an input voltage, and
generating a second voltage based in part on the input voltage, wherein the second voltage varies between a first low voltage and a first high voltage;
with a first stage output circuit comprising a first plurality of medium voltage switches:
receiving the second voltage, and
generating a third voltage based in part on the second voltage, wherein the third voltage varies between the first low voltage and a second high voltage;
with a second stage input circuit comprising a second plurality of medium voltage switches:
receiving the third voltage, and
generating a fourth voltage based in part on the third voltage, wherein the fourth voltage varies between a second low voltage and the second high voltage, wherein the second low voltage is greater than the first low voltage;
with a second stage output circuit comprising a third plurality of medium voltage switches:
receiving the fourth voltage, and
generating a fifth voltage based in part on the fourth voltage, wherein the fifth voltage varies between the second low voltage and a third high voltage; and
with a buffering circuit:
receiving the fifth voltage, and
generating an output voltage based in part on the fifth voltage, wherein the output voltage varies between a third low voltage and the third high voltage.

16. The method of claim 15, wherein the second high voltage is greater than the first low voltage, and wherein the second high voltage is less than the third high voltage.

17. The method of claim 15, wherein the second low voltage is equal to the third low voltage.

18. The method of claim 15, wherein the first stage output circuit comprises a plurality of low voltage switches.

19. The method of claim 15, wherein the first high voltage is greater than the first low voltage and is less than the third high voltage.

20. The method of claim 15, wherein each switch of the level shifter circuit is either a low voltage switch or a medium voltage switch.

* * * * *